United States Patent [19]

Trewiler

[11] Patent Number: 4,954,200
[45] Date of Patent: Sep. 4, 1990

[54] METHOD OF MAKING DRILL BACK-UP MATERIAL FOR SMALL BORE DRILLING OF CIRCUIT BOARDS

[75] Inventor: Carl E. Trewiler, Coshocton, Ohio

[73] Assignee: The General Electric Company, Worthington, Ohio

[21] Appl. No.: 289,568

[22] Filed: Dec. 22, 1988

Related U.S. Application Data

[62] Division of Ser. No. 118,990, Nov. 10, 1987.

[51] Int. Cl.$^5$ .............................................. B32B 31/18
[52] U.S. Cl. .................................... 156/344; 156/151; 156/330; 156/631; 408/1 R; 408/704
[58] Field of Search ............... 156/151, 344, 631, 330; 408/1, 704

[56] References Cited

U.S. PATENT DOCUMENTS

| | | | |
|---|---|---|---|
| 3,475,513 | 10/1969 | Benson . | |
| 3,700,341 | 10/1972 | Block | 408/1 |
| 4,354,895 | 10/1982 | Ellis | 156/631 |
| 4,496,695 | 1/1985 | Sugio et al. | 525/391 |
| 4,555,414 | 11/1985 | Hoover et al. | 427/43.1 |
| 4,567,216 | 1/1986 | Qureshi et al. | 523/400 |
| 4,737,208 | 4/1988 | Bloechle et al. | 156/90 |

FOREIGN PATENT DOCUMENTS 0126494 11/1984 European Pat. Off. .
101319 6/1982 Japan .

Primary Examiner—Robert A. Dawson
Attorney, Agent, or Firm—Mueller and Smith

[57] ABSTRACT

Disclosed is an improved back-up sheet for backing a workpiece during a small bore drilling process. The sheet also possesses electrical properties making it an ideal candidate as a laminate (reinforcing layer or bonding sheet) in the construction of multi-layer printed wiring boards. The sheet or laminate comprises the cured residue of:
  (a) polyphenylene oxide;
  (b) a bisphenol A-type epoxy resin; and
  (c) an amine hardener for said epxoy resin, the weight ratio of a:b+c ranging from about 1:10 to 1:2.

6 Claims, 3 Drawing Sheets

METHOD OF MAKING DRILL BACK-UP MATERIAL FOR SMALL BORE DRILLING OF CIRCUIT BOARDS

This application is a division, of application Ser. No. 07/118,990, filed Nov. 10, 1987.

BACKGROUND OF THE INVENTION

The present invention relates to drill entry or back-up materials for drilling small holes in substrates and more particularly to improved drill back-up materials for use in small bore drilling of circuit boards.

In recent years, there has been an accelerating trend towards simultaneous circuit size reduction and expansion of function in high performance electronic systems. Printing wiring board (PWB) technology has played an integral role in this evolution. Surface mount technology (SMT) has introduced new requirements in the design of PWBs, such as the use of substrates with fine lines and close spacing, small diameter plated through holes (PTH) and vias, and chip carriers with large numbers of fillet solder joints.

In multi-layer printed wiring board construction (MLPWB), the evolution of PWB laminates (often composed of multiple thin laminates or "thin lams") has been prompted by greater device complexity, as well as the need to package these devices in a smaller volume. Maximum circuit integrity under adverse conditions also is a design criterion. Selection of materials which exhibit desirable characteristics is one method for improving PWB performance. Both the resin system or matrix as well as the reinforcing materials need to be tailored, as does their combination, in order for PWBs to continue to keep pace with chip development. Resin systems, for example, generally are found to require a compromise from among properties such as low bulk coefficient of thermal expansion (CTE), low dielectric constant ($E_r$), high thermal stability, high glass transition temperature ($T_g$), and ease of processing.

The foregoing requirements, perhaps, can be better appreciated when it is realized that conventional (and future) ceramic chip carrier materials require an in-plane CTE as low as 0 ppm/° C. and as high as 15 ppm/° C. (ppm, for present purposes, representing $10^{-6}$). In-plane CTE values in this range also will facilitate future implementation of direct die-to-bond attachment. A close Z-axial composite expansion to match copper (17 ppm/° C.) also is important to reduce stress in PTHs. Reduced dielectric constant (say, under 3.0 at 1 KHz—10 MHz) becomes increasingly desirable at high device clock rates since this minimizes propagation delay. Additional problems requiring addressing include LCCC (leadless ceramic chip carrier), solder joint thermal fatigue and plated hole barrel cracking.

MLPWBs typically are constructed from a series of individual PWBs having insulative layers separating each PWB. Standard multi-layer boards, for example, can range from about 2 to 20 layers, each laminant ranging in dielectric thickness from about 1 to 250 mils. Heretofore, it has been possible to successfully drill holes (PTHs and vias, for example), down to about 0.006 inch in diameter or less in PWBs constructed of conventional material. However, more recently, MLPWBs have resorted to a variety of exotic materials in order to meet the increasing demands made upon them. It will be appreciated that the pad on each layer of the MLPWB has to have the hole precisely centered therethrough, especially as chip density increases. It will be appreciated that some manufacturers require an accuracy of about 0.0002 inch. Wandering of the drill can result in an off-centered hole through the pad, thus compromising the efficacy of the board, or can result in breakage of the drill.

Consequently, the art has resorted to materials in sheet form which are placed on both sides of the board to be drilled, the upper material serving as a drill entry sheet, while the lower sheet serving as a back-up sheet. For present purposes, both sheets are described as "back-up" sheets often herein. The drill entry sheet acts as a bushing for the drilling operation, while the back-up or lower sheet serves as a run out function so that the full diameter of the drill can penetrate the lowestmost board, if MLPWBs are being drilled. One back-up material for this use is disclosed in U.S. Pat. No. 4,643,963. Nevertheless, improvements in back-up material composition is an ever increasing need in the art.

BROAD STATEMENT OF THE INVENTION

The present invention is addressed to a back-up sheet for backing a workpiece during a small bore drilling process. The improvement comprises said back-up sheet comprising the cured residue of: (a) polyphenylene oxide, (b) bisphenol-A type epoxy resin, and (c) an amine hardener for said epoxy resin. The weight ratio of a:b+c ranges from about 1:10 to about 1:2. The back-up sheet contains no reinforcing or other filler materials. In a process for the small bore drilling of a workpiece, the improved process comprises placing a back-up sheet on both sides of the workpiece to be drilled and drilling the workpiece through the back-up sheets. The back-up sheet comprises the cured residue described above.

Advantages of the present invention include a back-up sheet which provides good dimensional stability during the small bore drilling process. Another advantage is that the improved back-up sheet in uncured form possesses excellent shelf life. A further advantage is that the uncured composition can be readily prepared and cast as a film utilizing conventional techniques. Another advantage is a composition possessing a low dielectric constant, thus making it a candidate for reinforcement and use in MLPWB construction. These and other advantages will become readily apparent to those skilled in the art based upon the disclosure contained herein.

The drawings will be described in detail in connection with the following description of the invention.

DETAILED DESCRIPTION OF THE INVENTION

Figure 1:
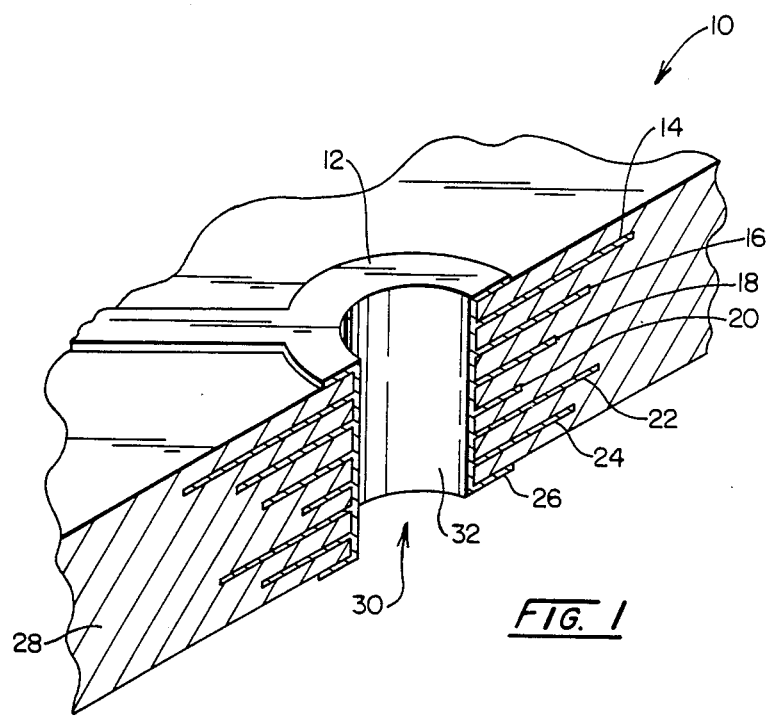
FIG. 1 is partial perspective section through a PTH of an MLPWB, such as results from a small bore drilling and plating operation.

The difficulties encountered in drilling a true hole through MLPWBs can be appreciated readily by reference to FIG. 1. In FIG. 1, a conventional eight-layer MLPWB is set forth in cross-sectional elevational view. It will be observed that upper conductive layer 12 is followed by conductive layers 14–24, and finally lower conductive layer 26. The reinforced dielectric material bearing the noted conductive layers merely is represented as 28, though it will be appreciated that a homogeneous composition throughout is not a limitation on the laminate set forth at FIG. 1. In order to interconnect the various circuit layers, hole 30 is drilled through the laminate construction. Thereafter, copper or other conductive layer 32 is plated through the walls of hole 30 in conventional fashion. Aspect ratios of PTH or via 30 often range from about 1:1 to 1:10 (diameter to height) in accordance with modern MLPWB technology.

It will be appreciated that the pad of copper or other conductive layer has been aligned quite precisely in order that hole 30, often only 4 mils in diameter, is drilled true with respect to each conductive layer. Close tolerances, often to 0.0002 inch accuracy, are required in modern MLPWB technology. If hole 30 is not drilled true, MLPWB 10 itself may need to be discarded, often resulting in the waste of many hours of construction time and effort. Moreover, due to the exotic nature of materials currently used and contemplated in MLPWB construction, drill breakage is another problem to be avoided, both in terms of the cost in drill replacement as well as the loss of productivity occasioned thereby.

Figure 2:
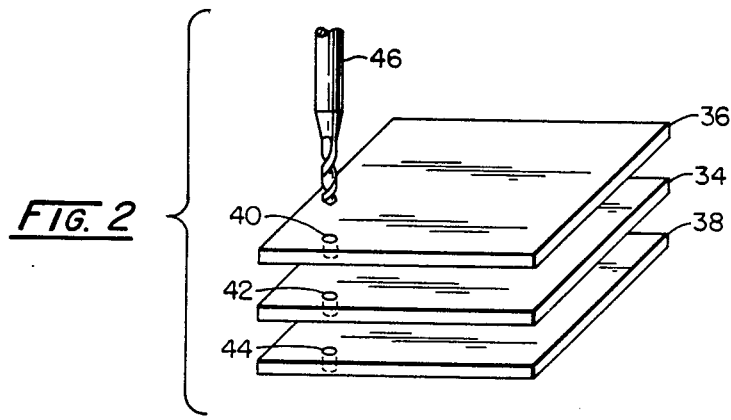
FIG. 2 is a perspective view showing construction of a circuit board/back-up sheet laminate for small bore drilling.

Accordingly, as represented at FIG. 2, laminate 34 has drill entry sheet 36 and drill back-up sheet 38 placed on either side thereof. When drill bit 46 enters hole 40, sheet 36 acts as a bushing to ensure alignment of the drill bit as it enters hole 42 in laminate 34. The location and angle of the bit as it contacts laminate 34 for production of hole 42 needs to be precise and true. Sheet 38 acts as a run-out sheet into which the drill bit enters as the whole diameter of the bit is needed in forming hole 42, typically. It will be appreciated that the thickness of the back-up sheet is not particularly critical, with cost being an important factor. Nevertheless, the drill bit should not be swayed off course by back-up sheet 38 lest drill breakage and compromise of the integrity of hole 42 result thereby.

By the same token, a minimum thickness in entry sheet 36 typically is required in order for the bushing affect to be prominent. Typically the thickness will be at least about 1 mil and can range on up to 15 mils or higher, with greater thicknesses often resulting in waste of material without corresponding benefit occasioned thereby. Advantageously, the thickness will be from about 3 to 10 mils and preferably about 8 mils.

The back-up sheet composition is formulated from polyphenylene oxide ranging in molecular weight from about 5,000 to 30,000 and an intrinsic viscosity (in toluene) of about 0.2 to 0.8 and preferably about 0.4 to 0.5. The thermoplastic PPO is soluble in a variety of organic solvents, including toluene, tetrahydrofuran (THF), and $C_2$–$C_3$ chlorinated organic solvents (e.g. carbon tetrachloride, chloroform, methylene chloride, etc.).

The thermoset portion of the composition comprises a mixture of a bisphenol-A type epoxy resin and a hardener therefor. The epoxy/hardener composition is soluble in a variety of solvents including acetone, methyl cellosolve, dimethyl formamide (DMF), toluene, and most ketones. Often, a single solvent will not solvate both the PPO and the epoxy/amine hardener.

Particular bisphenol-A type epoxy resins, including brominated derivatives, are well known in the art and can be selected from a variety of commercial resins including various Epon resins (Shell Chemical Company) and DER resins (Dow Chemical Company), as those skilled in the art will appreciate. Bromine contents can range up to about 45 percent, for example, for such resins.

"Amine hardeners", for present purposes, include simple polyamines, such as diethylene triamine, triethylene tetraamine, or the like, or can be an amidoamine from the reaction product of a dimer acid or a fatty acid with a polyamine. Preferably, however, a bismaleimide-triazine hardener is used. The proportion of hardener is adjusted and maintained in accordance with the epoxy functionality of the epoxy resin. The weight ratio of the PPO to epoxy/hardener combination ranges from about 1:10 to about 1:2, and still efficacious drill sheets being formed thereby.

In practicing the present invention, the solution of PPO is blended with the solution of epoxy/amine hardener under agitation. Since the solvent for each portion of the composition is not a solvent for the other portion, but rather acts more as a thet solvent, a thixotropic, lumpy, uncured product, resembling mud, results. Heating and agitation assist in maintaining the fluidity of the composition. Some epoxy resins evidence short shelf lives, and others do not, this characteristic being within the expertise of those skilled in this art.

When preparing to cast a film from the foregoing composition, the mixture or dispersion preferably is stirred to fluidity and then permitted to thicken. It has been determined that processing and handling characteristics are optimized by conducting the coating operation just prior to the mixture gelling. The mixture can be cast as a film by a variety of conventional techniques, either as a free film or with a backing, such as metal, which later can be removed. In either event, the cast film then is dried for solvent expulsion under moderate heating. Thereafter, the final sheet can be formed by heating the composition to a temperature ranging from about 80° to 230° C. in a press with pressures of between about 25 and 2,500 psi being applied. Full cure of the thermoset components of the sheet is not always necessary in order for advantageous properties to be realized. The cooled sheet then is removed and cut to size for use in small bore drilling operations.

Two points should be made regarding the use of the PPO/epoxy/hardener composition as a drill back-up material. The first point is that small bore testing revealed that the composition preferably should be "under cured". In conventional epoxy/hardener sheet molding operations, it is conventional to bake the sheet after it has been pressed. Such post press baking is preferably omitted in the sheet preparation for use as a drill entry/back-up material. A second way envisioned for "under curing" the composition involves starving the epoxy/hardener portion of the composition in hardener content. By having less than a stoichiometric proportion of hardener, the epoxy thermoset portion of the composition would not be fully cured. Of course, in the preparation of reinforced laminates utilizing the PPO/epoxy/hardener composition, full cure should be practiced.

Figure 3:
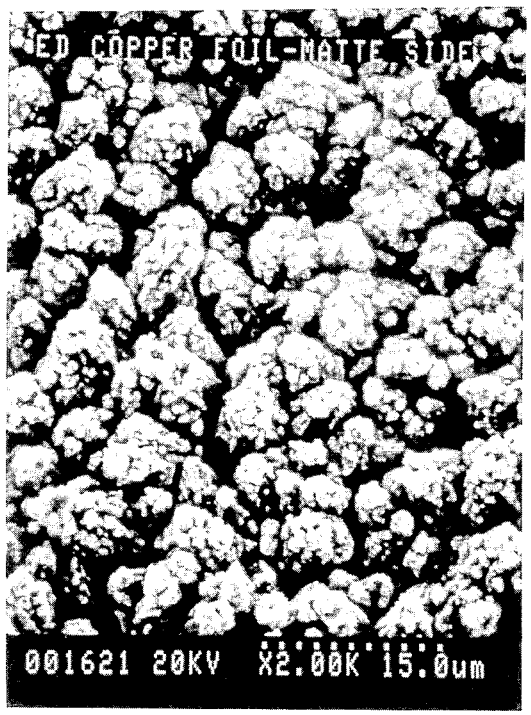
FIG. 3 is a scanning electron microscope photomicrograph (2000×) of the matte side of electrodeposited copper foil.
Figure 4:
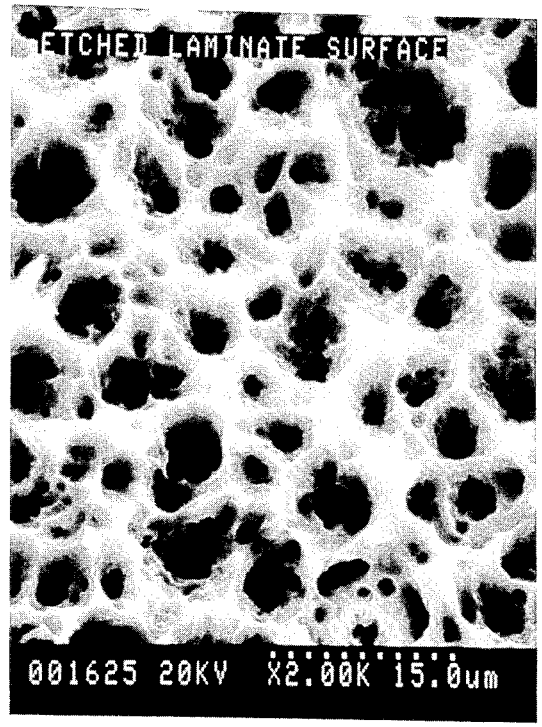
FIG. 4 is a scanning electron microscope photomicrograph (2000×) of the etched surface of the preferred back-up sheet of the present invention.

The second point involving the preparation of the PPO/epoxy/hardener film as a drill entry/back-up sheet involves a preferred technique discovered in the preparation of the sheet. Preferably, the liquid PPO/epoxy/hardener blend is cast on the matte side of electrodeposited copper foil. This aspect of the present invention is illustrated at FIGS. 3 and 4. FIG. 3 is a scanning electron microscope photomicrograph at 2,000 magnification taken of the matte side of electrodeposited copper foil. It will be observed that the matte side of the copper foil exhibits a distinct topography reminiscent of mountains or peaks having rounded apexes. As noted above, the blend is cast on this matte side of the electrodeposited copper foil, pressed, and partially cured, thereafter, the copper is etched away to leave a sheet having a corresponding surface topography as depicted at FIG. 4 which is a scanning electron microscope photograph at 2,000 magnification taken of the etched surface of the drill back-up sheet. The surface exhibits a relief corresponding to the negative of the topography of the surface of the matte side of the copper foil. It is believed that the multiplicity of valleys or recesses each are capable of receiving the drill bit and acting as a bushing during the drilling operation to focus the drill at the desired site for creation of the bore with less drill wander being evidenced. In this regard, it is believed that this technique similarly can be applied to other materials which conventionally have been used in the formation of drill entry/back-up sheets and improved drilling resulting thereby. Such conventional materials include aluminum, which predominates in the industry today, as well as newer polymeric-based films, such as described in U.S. Pat. No. 4,643,396. It also should be understood that other electrodeposited metals have matte sides which may mimic that depicted at FIG. 3 and similarly find usefulness in the present invention.

Unexpectedly, it was determined that the cured sheet possessed rather good dielectric properties, including dielectric constant and dissipation factor. Dielectric constants of less than 3 at frequencies ranging from about 1 to 1,000 MHz were determined, for example. Thus, the composition is an ideal condidate for reinforcement in the production of reinforced laminates for circuit board and other electrical/electronic utilization. Representative reinforcing fibers and fabric include, for example, poly-p-phenylene terephthalamide (e.g. Kevlar brand, E.I. duPont de Nemours and Co.), E glass, S glass, quartz fiber, metal fiber, ceramic fiber, and the like. Reinforcing fiber can be used in fiber form, or as a mat, cloth or other conventional form.

The following example shows how the invention has been practiced, but should not be construed as limiting. In this application, all units are in the metric system unless otherwise indicated. Also, all citations are expressly incorporated herein by reference.

EXAMPLE

The general procedure in making the inventive back-up sheets involved the agitation of PPO in toluene solvent under heating to 70°-80° C. until the PPO had dissolved. A solution of bismaleimide-triazine resin dissolved in acetone solvent was added to the brominated epoxy resin solution (acetone solvent) and cure adjusted to 200-220 sec. at 171° C. with 10% solution of zinc octoate catalyst. Upon cooling of the PPO solution to 60°-70° C., the epoxy/amine hardener solution was added thereto. Haze formation was evident, indicating the incompatibility of the two resinous systems. This mixture was reheated to 65°-75° C. and cooled. Just before use, the mixture was agitated vigorously. The following formulations were prepared:

TABLE 1

| Ingredient | Formulations (gm) | | | | |
|---|---|---|---|---|---|
| | A | C | D | E | G |
| Final Mix | | | | | |
| PPO[1] | 100 | 100 | 100 | 100 | 100 |
| Toluene | 400 | 400 | 400 | 400 | 400 |
| Base Mix* | 933.3 | 465.9 | 344.4 | 311.1 | 233.3 |
| *Base Mix | | | | | |
| BT2710[2] | 137.9 | 68.9 | 50.9 | 46.0 | 34.5 |
| Acetone | 137.9 | 68.9 | 50.9 | 46.0 | 34.5 |
| Epoxy Resin[3] | 459.7 | 229.5 | 169.7 | 153.2 | 114.9 |
| Acetone | 197.7 | 98.7 | 72.9 | 65.9 | 49.5 |
| Total Solids | 697.7 | 398.4 | 320.4 | 299.2 | 249.4 |
| % PPO Solids | 14.3 | 25.1 | 31.2 | 33.4 | 40.1 |
| Dielectric Constant | | | | | |
| at 1 MHz | 3.31 | 3.18 | 3.11 | 3.11 | 3.05 |
| Dissipation Factor | | | | | |
| at 1 MHz | 0.013 | 0.013 | 0.011 | 0.011 | 0.010 |

(1) PPO was grade 691-111, intrinsic viscosity of 0.46, General Electric Company
(2) BT2170 bismaleimide-triazine (melt point 60°-70°, sp. gravity 1.24, Tg hardened resin ca. 260° C., Brown color) Mitsubishi Gas Chemical Co., Tokyo, Japan.
(3) Diglycidyl ether of bis-phenol A/tetrabromobisphenol A adduct in acetone solvent (specifications: specific gravity at 25° C. of 1.16-1.172, 69.3-71.1% solids, Hoepples viscosity at 25° C. of 220-328, epoxide eq. wt. (solids 380-405).

Base mix cure relied on about 0.25 g of zinc octoate catalyst as described above. Each formulation was applied onto the matte side of electrodeposited copper foil using a knife-over-roll spreader and passed into a horizontal oven for solvent removal and flow control (e.g. 5 minutes at 100° C., 5 minutes at 130° C., and 2 minutes at 150° C.). Cure was achieved at 300 psi for 40 minutes at 168°-172° C. in a laboratory press. Upon cooling, the copper was etched to produce the drill entry/back-up sheet.

Each of the formulation sheets make excellent drill back-up sheets. Moreover, because of the good electrical properties of the sheets, circuit board laminates or other similar uses can be envisioned. For example, preferred formulation C was subjected to dielectric constant and dissipation factor measurements (Hewlet-Packard HP 4149A impedance analyzer) with the following results being recorded.

TABLE 2

| Frequency (MHz) | Dielectric Constant | Dissipation Factor |
|---|---|---|
| 10 | 2.7 | 0.01 |
| 100 | 2.8 | 0.007 |
| 200 | 2.8 | 0.0084 |
| 500 | 2.8 | 0.010 |
| 750 | 2.9 | 0.0125 |
| 1000 | 2.9 | 0.0137 |

Microscopic examination of etched films indicated that the PPO was not completely dissolved but rather was dispersed as very small spherical particles.

In order to demonstrate the dielectric properties of the cured sheet which make it a candidate for reinforcement in the production of reinforced laminates, formulation C was reinforced with glass mat, glass cloth, Kevlar brand mat, and Kevlar brand cloth. The resulting reinforced sheets were subjected to a variety of tests in order to evaluate the dielectric properties of the resulting reinforced sheets. The results recorded are set forth below.

TABLE 3

| Reinforcing Fiber | Water Absorption (%) | "As Is"[1] Dielectric Constant | "As Is"[1] Dissipation Factor | D-24/23[2] Dielectric Constant | D-24/23[2] Dissipation Factor | Insulation[3] Resistance |
|---|---|---|---|---|---|---|
| Glass Mat | 0.28 | 3.03 | 0.012 | 3.16 | 0.017 | 239 |
| Glass Cloth | 0.55 | 3.03 | 0.010 | 3.07 | 0.011 | 35,625 |
| Kevlar Mat | 0.80 | 2.94 | 0.011 | 3.01 | 0.013 | 33,400 |
| Kevlar Cloth | 1.24 | 3.08 | 0.013 | 3.26 | 0.017 | 10,888 |

[1]Reinforced sheets tested without aging.
[2]Reinforced sheets immersed for 24 hours in 23° C. water before testing.
[3]Surface resistance in gigaohms using an etched comb pattern after 96 hours exposure at 35° C. and 90% relative humidity.

The above-tabulated results show that the reinforced sheets tested possessed moderate to good dielectric properties on balance, and quite acceptable dielectric constant and dissipation values in particular.

I claim:

1. In a method for small bore drilling of a workpiece wherein back-up sheets are placed on both sides of said workpiece during said drilling, the improvement for making said back-up sheets for backing said workpiece during said small bore drilling process which comprises:
   (a) disposing the uncured ingredients for said sheet on the matte side of an electrodeposited metal foil;
   (b) pressing and heating the ingredients/foil formed in step (a) to at least partially cure said ingredients for forming said sheet; and
   (c) removing said metal foil from said sheet for said sheet to be used as a backing during said small bore drilling process.

2. The method of claim 1 wherein said metal foil comprises electrodeposited copper foil.

3. The method of claim 1 wherein said uncured ingredients comprise polyphenylene oxide, bis-phenol A-type epoxy resin, and an amine hardener for said epoxy resin, wherein the weight ratio of polyphenylene oxide to epoxy resin/hardener ranges from about 1:10 to 1:2.

4. The method of claim 2 wherein said uncured ingredients comprise polyphenylene oxide, bis-phenol A-type epoxy resin, and an amine hardener for said epoxy resin, wherein the weight ratio of polyphenylene oxide to epoxy resin/hardener ranges from about 1:10 to 1:2.

5. The method of claim 3 wherein said epoxy resin comprises a diglycidyl ether of bis-phenol A/tetrabromobis-phenol A adduct and said hardener comprises a bismaleimide-triazene compound.

6. The method of claim 4 wherein said epoxy resin comprises a diglycidyl ether of bis-phenol A/tetrabromobis-phenol A adduct and said hardener comprises a bismaleimide-triazene compound.

* * * * *